US011742441B2

(12) United States Patent
Chiu

(10) Patent No.: US 11,742,441 B2
(45) Date of Patent: Aug. 29, 2023

(54) FLEXIBLE AND ROLLABLE BACK-CONTACT SOLAR CELL MODULE AND PREPARATION METHOD THEREOF

(71) Applicant: Golden Solar (Quanzhou) New Energy Technology Co., Ltd., Quanzhou (CN)

(72) Inventor: Hsin-Wang Chiu, Quanzhou (CN)

(73) Assignee: GOLDEN SOLAR (QUANZHOU) NEW ENERGY TECHNOLOGY CO., LTD., Quanzhou (CN)

( * ) Notice: Subject to any disclaimer, the term of this patent is extended or adjusted under 35 U.S.C. 154(b) by 0 days.

(21) Appl. No.: 17/644,800

(22) Filed: Dec. 17, 2021

(65) Prior Publication Data

US 2022/0416101 A1 Dec. 29, 2022

(30) Foreign Application Priority Data

Jun. 24, 2021 (CN) .......................... 202110705336.8

(51) Int. Cl.
*H01L 31/0224* (2006.01)
*H01L 31/048* (2014.01)
*H01L 31/05* (2014.01)
*H01L 31/18* (2006.01)

(52) U.S. Cl.
CPC .. *H01L 31/022458* (2013.01); *H01L 31/0481* (2013.01); *H01L 31/0512* (2013.01); *H01L 31/0516* (2013.01); *H01L 31/1876* (2013.01)

(58) Field of Classification Search
CPC ......... H01L 31/022458; H01L 31/0481; H01L 31/0512; H01L 31/0516; H01L 31/1876
See application file for complete search history.

(56) References Cited

U.S. PATENT DOCUMENTS

2013/0104958 A1 5/2013 Lantzer et al.
2014/0370650 A1* 12/2014 Moslehi .............. H01L 27/1421
438/98
(Continued)

FOREIGN PATENT DOCUMENTS

CN 108429524 A 8/2018
CN 110277466 A 9/2019
(Continued)

*Primary Examiner* — Tae-Sik Kang
(74) *Attorney, Agent, or Firm* — Bayramoglu Law Offices LLC

(57) ABSTRACT

A flexible and rollable back-contact solar cell module, wherein a length of it can be extended infinitely and the back-contact solar cell module includes a plurality of large cell blocks connected in series or in parallel. The large cell block includes a plurality of small cell strings connected in series or in parallel. The small cell string includes a plurality of small square cell pieces connected in series or in parallel. The series-connection or the parallel-connection between the large cell blocks, the small cell strings, or the small square cell pieces is achieved by welding a flexible interconnected bar in the horizontal or vertical direction. Electrodes of the small square cell pieces are all on a back side and the small square cell pieces are formed by cutting a back-contact solar cell. A protective layer is attached to a surface of a light-receiving side by using an adhesive layer.

16 Claims, 6 Drawing Sheets

(56) References Cited

U.S. PATENT DOCUMENTS

| | | | |
|---|---|---|---|
| 2015/0075582 A1* | 3/2015 | Steckemetz | H01L 31/022433 |
| | | | 136/244 |
| 2017/0279402 A1* | 9/2017 | Schmaelzle | H01L 31/0488 |
| 2017/0288081 A1 | 10/2017 | Babayan et al. | |
| 2018/0198007 A1 | 7/2018 | Cheun et al. | |

FOREIGN PATENT DOCUMENTS

| | | |
|---|---|---|
| CN | 110676345 A | 1/2020 |
| CN | 111244217 A | 6/2020 |
| CN | 112490312 A | 3/2021 |
| TW | 201225318 A | 6/2012 |

\* cited by examiner

FLEXIBLE AND ROLLABLE BACK-CONTACT SOLAR CELL MODULE AND PREPARATION METHOD THEREOF

CROSS REFERENCE TO THE RELATED APPLICATIONS

This application is based upon and claims priority to Chinese Patent Application No. 202110705336.8, filed on Jun. 24, 2021, the entire contents of which are incorporated herein by reference.

TECHNICAL FIELD

The present invention relates to the field of solar cell preparation, and more particularly, to a flexible and rollable interdigitated back-contact (IBC) or heterojunction back-contact (HBC) solar cell module and a preparation method thereof.

BACKGROUND

In the previous generation of flexible solar cell module, the surface of the small cell chip is attached to a protection layer after cutting the solar cell chip into a plurality of small cell pieces. However, during the above process, many defects are caused because the size of the small cell piece is small and it requires a high precision for attaching to the protection layer. Moreover, the positive and negative electrodes of the small cell pieces for forming the flexible solar plate are on different sides of the cell, and the positive and negative electrodes of a small cell are required to be welded in series during production, where the other side is flipped over to be welded after the positive or negative electrode side is welded or both sides of the small cell are simultaneously welded after laid with an interconnected bar. Additionally, since the small cells for forming the flexible module are small in size, the required process is excessively precise, which make the processing more difficult. Moreover, the welding in a uniform horizontal direction for the small cells limits the design of a flexible cell module. Furthermore, since there are electrodes on both the light-receiving side and the back side of the cell, the interconnected bars welded in series will have a certain shading effect on the power generation side to reduce the power generation efficiency.

The most prominent feature of a back-contact solar cell (IBC, HBC) is that the positive-negative (PN) junction and the metal joint are both located at the back side of the solar cell, so as to completely avoid a block caused by the interconnected bar of the metal gate line electrode and the welding electrode on the front surface, which can maximize the use of incident light and reduce optical loss, so as to have relatively high short-circuit current. Meanwhile, the positive and negative electrodes of the cell are on the back side of the cell, which can further improve the process efficiency in the operation of welding the small cell piece. Succinctly, this type of the solar cell without the block on the front side not only has high conversion efficiency, but also has the advantages of beautiful appearance and the likes.

SUMMARY

In order to overcome the shortcomings of the prior art, the present invention provides a flexible and rollable back-contact solar cell module. A length of the back-contact solar cell module is allowed to be extended infinitely and the back-contact solar cell module includes a plurality of large cell blocks connected in series or in parallel; the large cell block includes a plurality of small cell strings connected in series or in parallel; the small cell string includes a plurality of small square cell pieces connected in series or in parallel; the series-connection or the parallel-connection between the large cell blocks, the small cell strings, or the small square cell pieces is achieved by welding a flexible interconnected bar in a horizontal direction or a vertical direction; electrodes of the small square cell pieces are all on a back side and the small square cell pieces are formed by cutting a back-contact solar cell; and a protective layer is attached to a surface of a light-receiving side by using an adhesive layer.

In order to gain the back-contact solar cell module, the technology adopted by the present invention includes:

pre-cutting the back-contact solar cell and the protective layer to form a plurality of incompletely-disconnected small square cell pieces and small square protective layers;

attaching the light-receiving side of the back-contact solar cell and the protective layer to each other by the adhesive layer;

performing fragmenting to form the plurality of small square cell pieces with the light-receiving side attached to the protective layer;

arranging the plurality of small square cell pieces by a chip automatic fragmenting and arrangement device, and affixing a high-temperature resistant tape to a middle of the back side to fix a position of the small square cell pieces, and then welding the small square cell pieces in series or in parallel by the flexible interconnected bar to form the small cell string;

arranging the plurality of small cell strings, and then welding the plurality of small cell strings in series or in parallel by the flexible interconnected bar to form the large cell block; and welding the plurality of large cell blocks in series or in parallel by the flexible interconnected bar to form the back-contact solar cell module according to design requirements.

Preferably, the back-contact solar cell module allowed to be extended infinitely can further be cut off at an appropriate position according to design requirements to re-form a plurality of large cell blocks, and the plurality of large cell blocks are re-connected in series or in parallel by the flexible interconnected bar to form a solar cell module satisfying new design requirements.

Preferably, the flexible interconnected bar in the horizontal direction is used to connect positive and negative electrodes of the large cell blocks when the back-contact solar cell module is formed by the large cell blocks connected in series.

Preferably, the flexible interconnected bar in the vertical direction is used to connect positive electrodes of the large cell blocks and connect negative electrodes of the large cell blocks when the back-contact solar cell module is formed by the large cell blocks connected in parallel.

Preferably, the small square cell piece has a length of 1-100 mm and a width of 1-100 mm, and the small square cell piece maintains a certain interval between each other.

Preferably, the flexible interconnected bar is a flexible copper clad laminate (FCCL) soft welding strip with a width of 0.1-20 mm, a flexible printed circuit board (FPCB), or a flexible tinned-copper strip; a gap between the small cell strings connected by the flexible interconnected bar is 0.1-5 mm.

Preferably, the protective layer is a hard material layer, and the hard material layer has a thickness of 0.2-2 mm and is glass, polycarbonate (PC), polymethyl methacrylate (PMMA), polypropylene (PP), polyethylene terephthalate (PET), or transparent fluorine material layer.

Preferably, the adhesive layer attached between the small square cell piece and the protective layer is silica gel, ethylene vinyl acetate (EVA) glue, polyolefin elastomer (POE) glue, double-sided glue or the like, and is cured by ultraviolet (UV) light or a high temperature.

Preferably, the back-contact solar cell is an interdigitated back-contact (IBC) solar cell or an interdigitated heterojunction back-contact (HBC) solar cell.

From the above description of the present invention, compared with the prior art, the present invention has the following advantages.

The back-contact solar cell module provided by the present invention can be extended infinitely, and the large cell blocks for forming the back-contact solar cell module can be freely combined in series, parallel, or series-parallel connection by simultaneously using the flexible interconnected bar in both horizontal and vertical directions according to the practical application requirements. Moreover, the back-contact solar cell and the protective layer are pre-cut and then attached to each other by the adhesive layer before fragmented, which makes the design of the solar cell module more flexible and the processing more convenient. Furthermore, the electrodes of the back-contact solar cell module are all on the back side, which not only facilitates the welding of the flexible interconnected bar, but also does not block the light-receiving side, so as to effectively improve the light utilization rate. Additionally, since the back-contact solar cell module provided by the present invention can be extended infinitely, the back-contact solar cell module provided by the present invention can further realize the design of the solar cell module with different current and voltage requirements on any width size.

BRIEF DESCRIPTION OF THE DRAWINGS

The drawings, as a part of the present application, are used to provide a further understanding of the present invention, and the schematic embodiments of the present invention and the descriptions thereof are used to explain the present invention and do not constitute an undue limitation of the present invention. In the drawings.

DETAILED DESCRIPTION OF THE EMBODIMENTS

In order to make the objectives, technical solutions, and advantages of the present invention clearer, the present invention is further described in detail below in conjunction with the drawings and embodiments. It should be understood that the specific embodiments described herein are used only to explain the present invention and are not used to limit the present invention.

Figure 1:
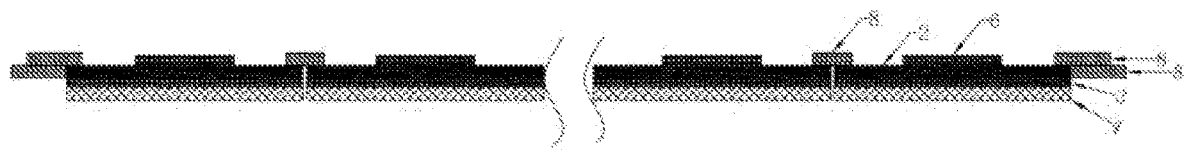
FIG. 1 is a cross-sectional structural schematic diagram of the back-contact solar cell module according to the present invention.
Figure 2:
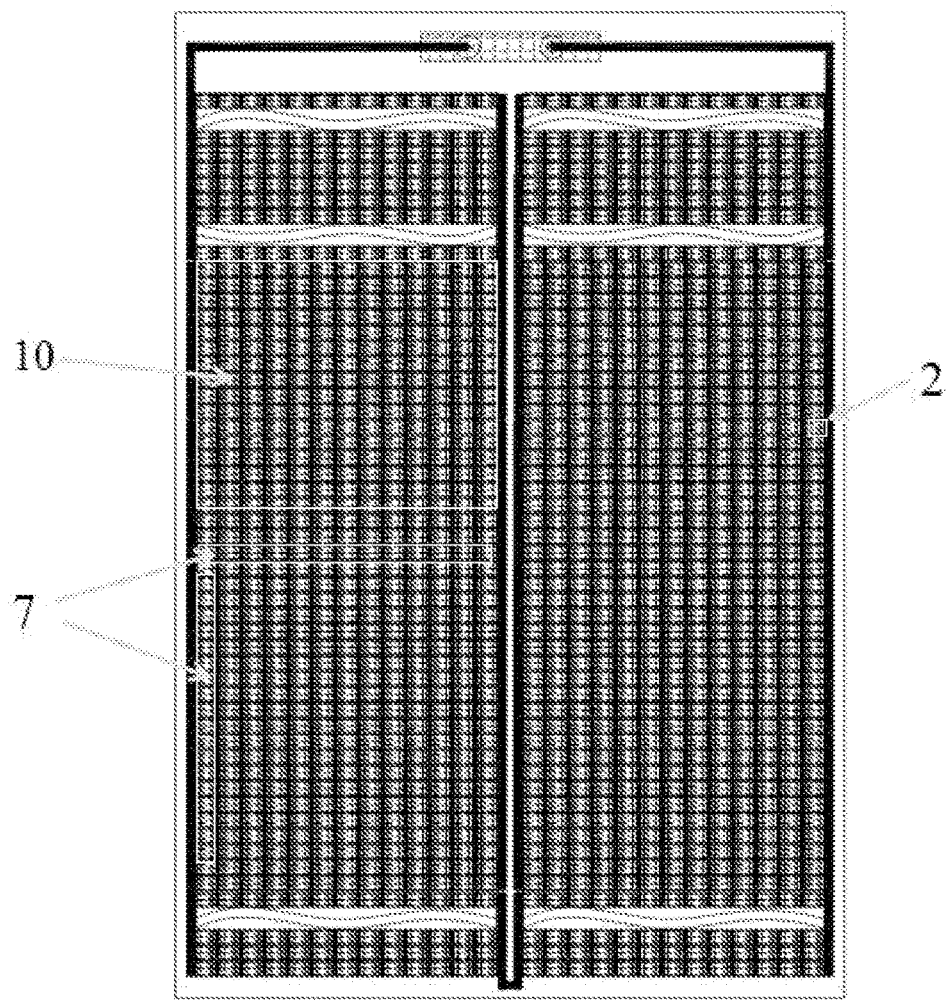
FIG. 2 is a structural schematic diagram showing the front of the back-contact solar cell module according to the embodiments of the present invention.

As shown in FIGS. 1 and 2, the present invention provides a flexible and rollable back-contact solar cell module. The length of the back-contact solar cell module can be extended infinitely and the back-contact solar cell module includes a plurality of large cell blocks 10 connected in series or in parallel. The large cell block 10 includes a plurality of small cell strings 7 connected in series or in parallel. The small cell string 7 includes a plurality of small square cell pieces 2 connected in series or in parallel. The series-connection or the parallel-connection between the large cell blocks 10, the small cell strings 7, or the small square cell pieces 2 is achieved by welding the flexible interconnected bar 8 in the horizontal or vertical direction. The electrodes of the small square cell pieces 2 are all on the back side and the small square cell pieces 2 are formed by cutting the back-contact solar cell 1. The protective layer 4 is attached to the surface of the light-receiving side by using the adhesive layer 3.

Figure 3:
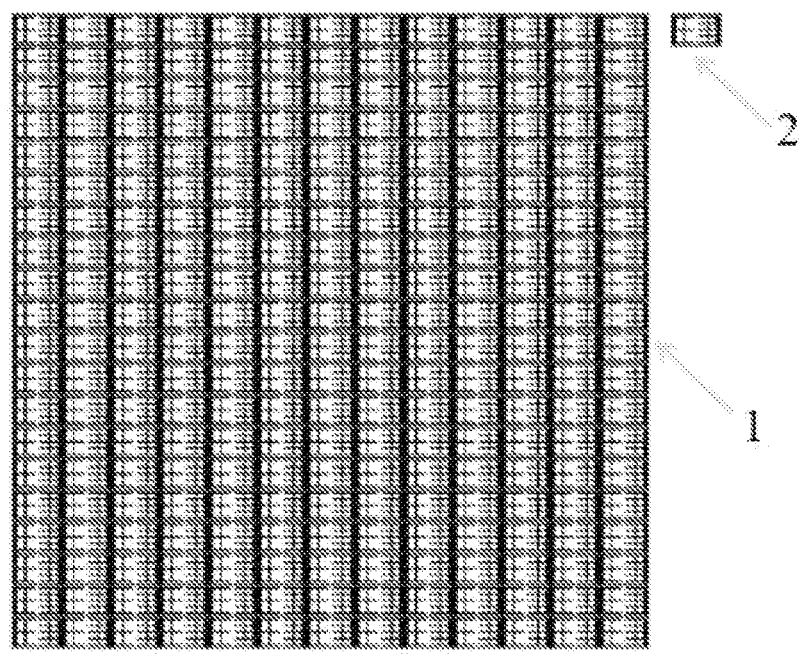
FIG. 3 is a schematic diagram showing a back-contact solar cell cut into small square cell pieces according to the present invention.

The preparation process of the back-contact solar cell module is as follows:

First of all, the back-contact solar cell 1 and the protective layer 4 are pre-cut to form a plurality of small square cell pieces 2 and small square protective layers 4 that are incompletely disconnected. As shown in FIG. 3, the back-contact solar cell 1 is a interdigitated heterojunction back-contact (HBC) solar cell, the cut small square cell piece 2 is 12.0 mm in length and 8.0 mm in width, and the positive and negative electrodes of the small square cell piece are on the back side of the cell.

Secondly, the light-receiving side of the back-contact solar cell 1 and the protective layer 4 are attached to each other by the adhesive layer 3. Specifically, the adhesive layer 3 is an optical silica gel cured at high temperature. The protective layer 4 is hard-material transparent glass with a thickness of 0.4 mm.

Subsequently, the back-contact solar cell 1 after being attached is fragmented to form a plurality of small square cell pieces 2 with the light-receiving side attached to the protective layer.

Figure 4:
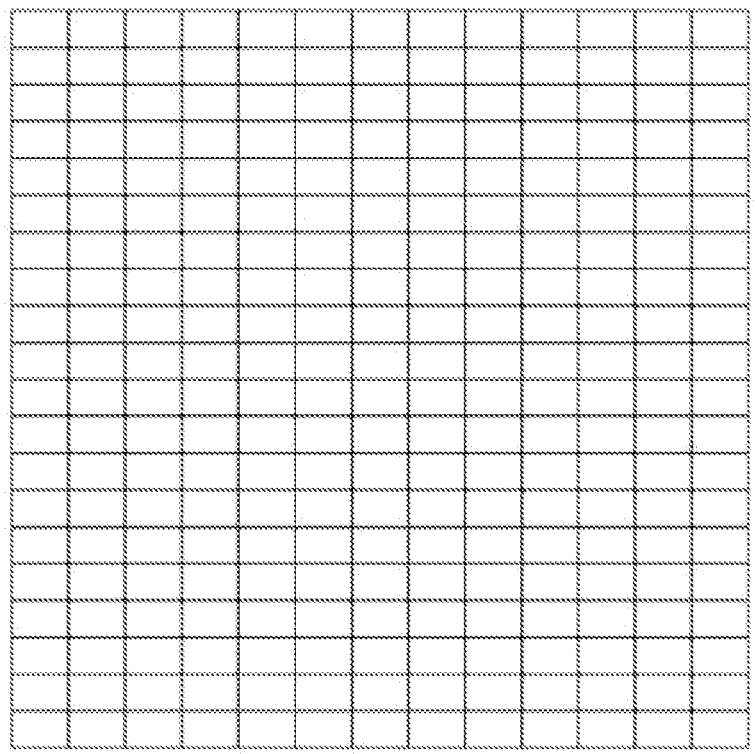
FIG. 4 is a structural schematic diagram showing the back-contact solar cell where the back-contact solar cell is attached to the hard material glass and then scribed into small square cell pieces according to the present invention.
Figure 5:
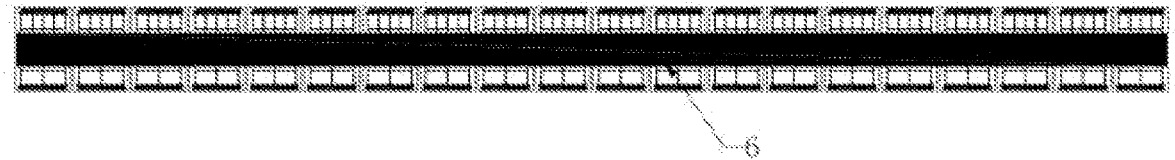
FIG. 5 is a structural schematic diagram showing the small square cell pieces arranged into a small cell string and affixed with a high-temperature resistant tape on the back side according to the present invention.

As shown in FIGS. 4 and 5, each string of twenty small square cell pieces 2 are arranged in an interval of 0.4 mm from each other by a chip automatic fragmenting and arrangement device, and the high-temperature resistant tape 6 is affixed to the middle of the back side to fix the position of the small square cell pieces 2, and then the small square cell pieces 2 are welded in series or in parallel by the flexible interconnected bar 8 to form the small cell string 7.

Figure 6:
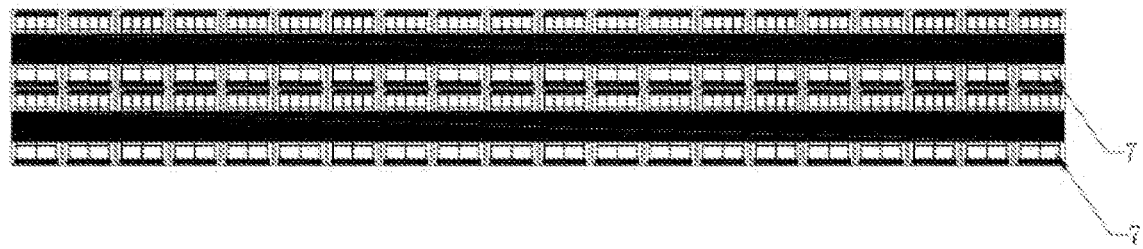
FIG. 6 is a structural schematic diagram showing two small cell strings arranged side by side according to the present invention.
Figure 7:
FIG. 7 is a structural schematic diagram showing two small cell strings with the flexible interconnected bar welded on the back side therebetween according to the present invention.
Figure 8:
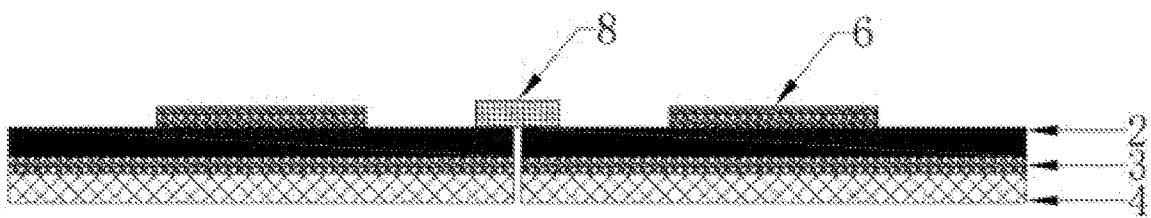
FIG. 8 is a cross-sectional structural schematic diagram showing two small cell strings connected in series by the flexible interconnected bar according to the present invention.
Figure 9:
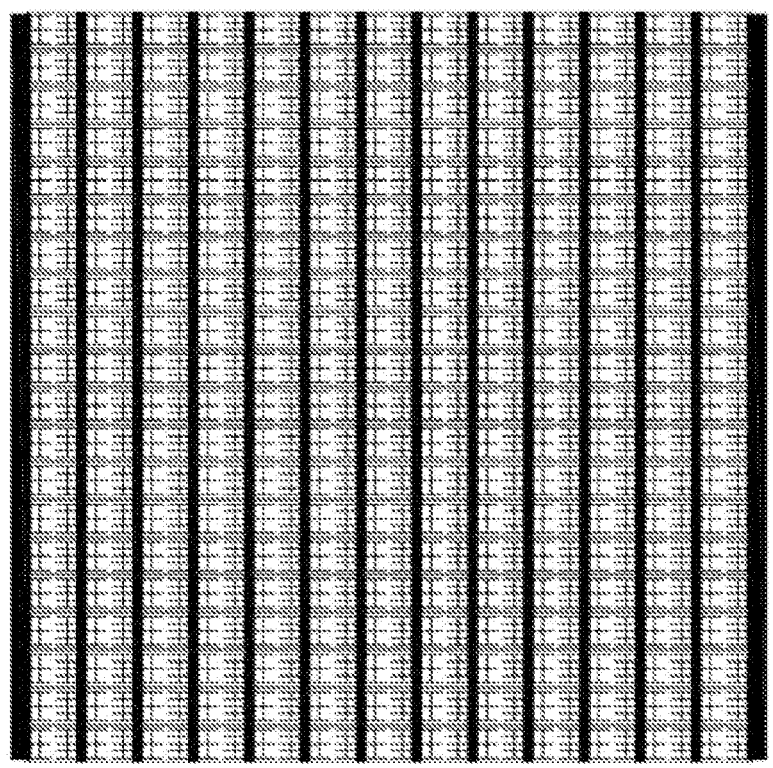
FIG. 9 is a structural schematic diagram of a large cell block according to the present invention.

As shown in FIG. 9, thirteen strings of the small cell strings 7 are arranged and then welded in series by the flexible interconnected bar 8 to form the large cell block 10, and the positive and negative electrodes of the outermost small cell string 7 are welded by the flexible interconnected bar 8 for being connected in series or in parallel with other large cell blocks. Specifically, the small cell strings 7 are arranged in an interval of 0.2 mm from each other (shown in FIG. 6), and the positive and negative electrodes of two small cell strings 7 are welded in series by the flexible interconnected bar 8 (shown in FIGS. 7 and 8).

Figure 10:
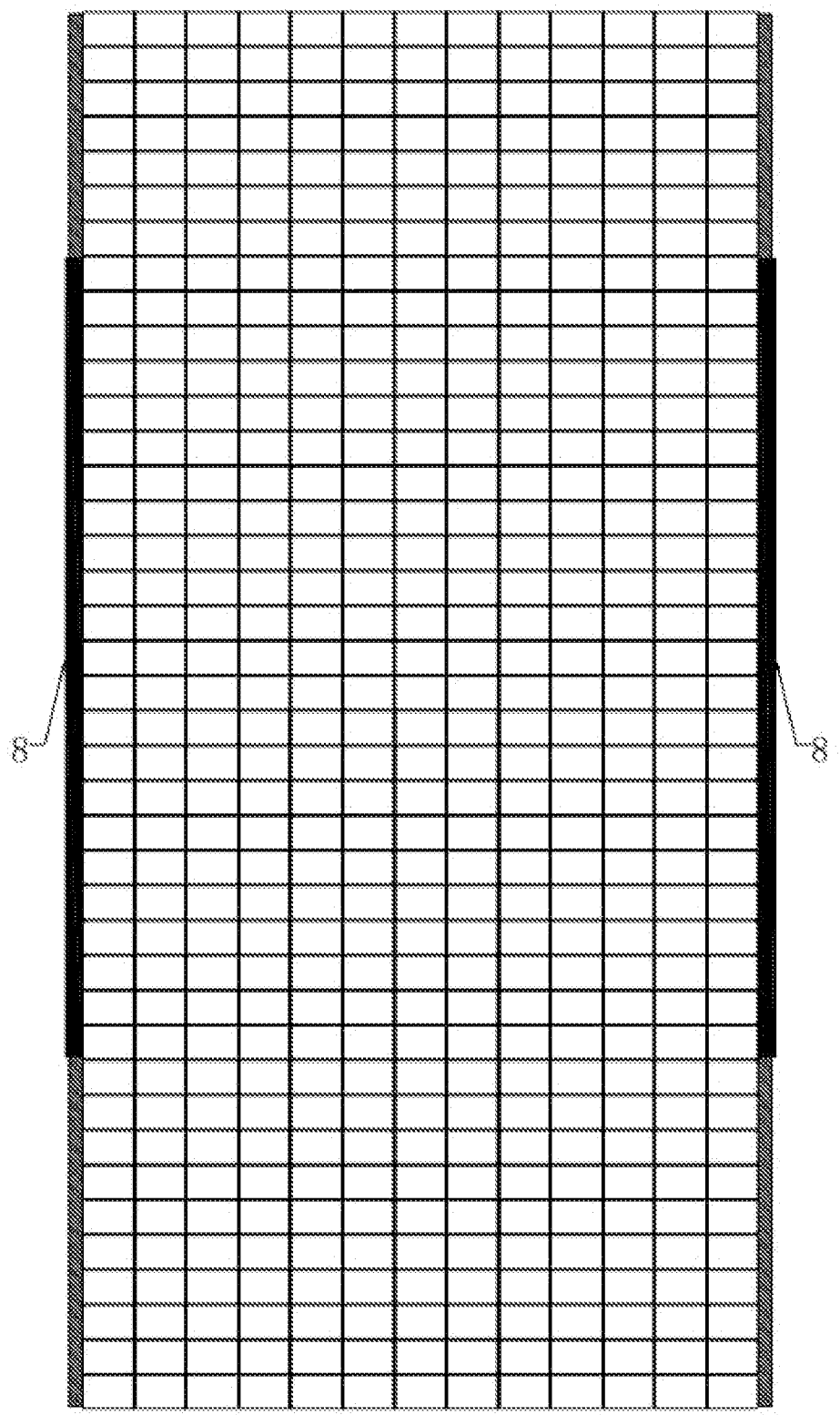
FIG. 10 is a structural schematic diagram showing the welding connection of two large cell blocks by the flexible interconnected bar according to the present invention.

As shown in FIG. 10, two large cell blocks 10 are welded in parallel by the flexible interconnected bar 8 to form the back-contact solar cell module according to the design requirements.

Figure 11:
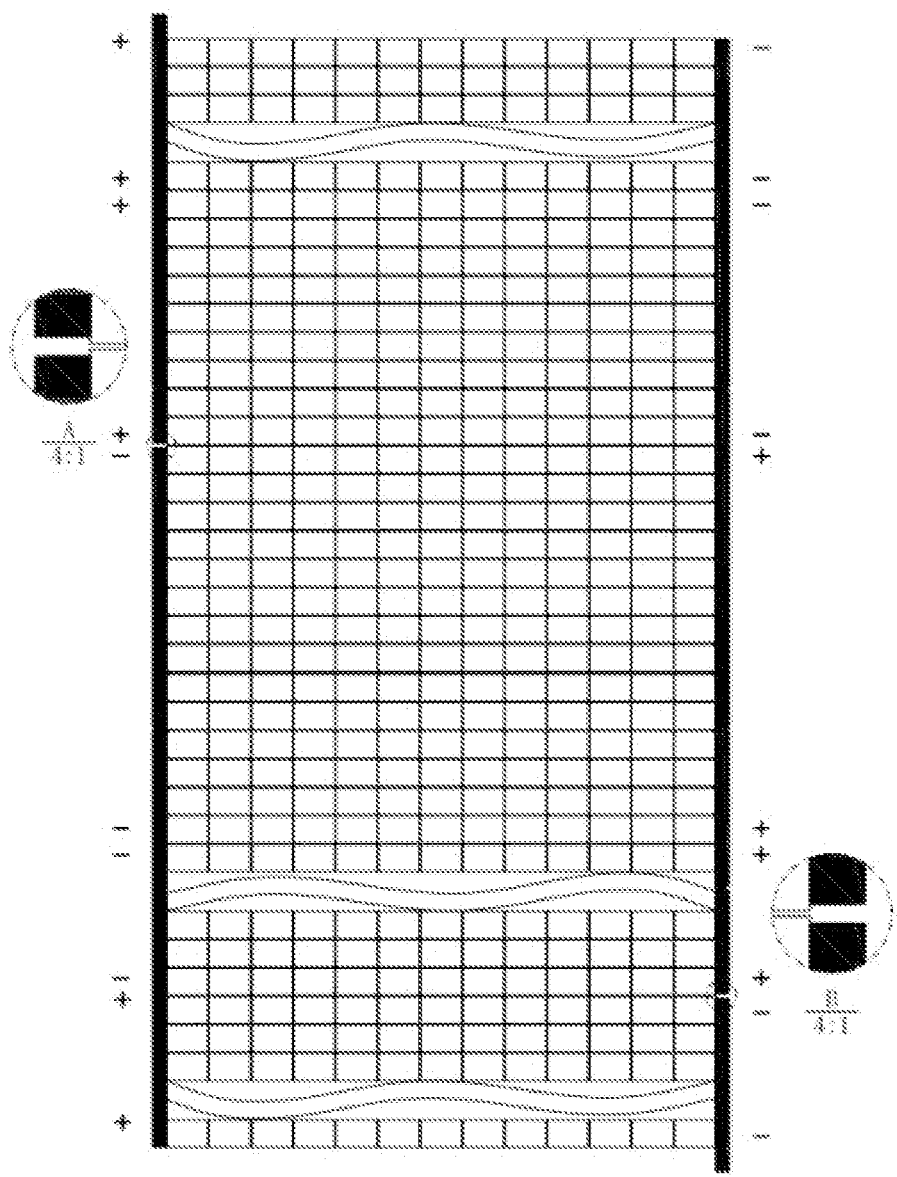
FIG. 11 is a structural schematic diagram showing that the back-contact solar cell module allowed to be infinitely extended is cut off in an appropriate position according to design requirements according to the present invention.

As shown in FIG. 11, after a plurality of large cell blocks 10 are connected in series or in parallel to form the back-contact solar cell module, the back-contact solar cell module can further be cut off at the required position and re-welded in series or in parallel by the flexible interconnected bar to form the new back-contact solar cell module according to the design requirements.

The back-contact solar cell module provided by the present invention can be extended infinitely, and the large cell blocks for forming the back-contact solar cell module can be freely combined in series, parallel, or series-parallel connection by simultaneously using the flexible interconnected bar in both horizontal and vertical directions according to the practical application requirements. Moreover, the back-contact solar cell and the protective layer are pre-cut and then attached to each other by the adhesive layer before fragmented, which makes the design of the solar cell module more flexible and the processing more convenient. Furthermore, the electrodes of the back-contact solar cell module are all on the back side, which not only facilitates the welding of the flexible interconnected bar, but also does not block the light-receiving side, so as to effectively improve the light utilization rate. Additionally, since the back-contact solar cell module provided by the present invention can be extended infinitely, the back-contact solar cell module provided by the present invention can further realize the design of the solar cell module with different current and voltage requirements on any width size.

The above only describes preferred embodiments of the present invention, which are not used to limit the present invention. Any modifications, equivalent replacements, and improvements made within the spirit and principles of the present invention shall fall within the scope of protection of the present invention.

What is claimed:

1. A flexible and rollable back-contact solar cell module, wherein a length of the flexible and rollable back-contact solar cell module is allowed to be extended and the flexible and rollable back-contact solar cell module comprises a plurality of large cell blocks connected in series or in parallel; each of the plurality of large cell blocks comprises a plurality of small cell strings connected in series or in parallel; each of the plurality of small cell strings comprises a plurality of small square cell pieces connected in series or in parallel; a series-connection or a parallel-connection between the plurality of large cell blocks, the plurality of small cell strings, or the plurality of small square cell pieces is achieved by welding a plurality of flexible interconnected bars in a horizontal direction or a vertical direction, wherein a first flexible interconnected bar of the plurality of flexible interconnected bars is formed along a total length of a first edge of a first large cell block of the plurality of large cell blocks formed by a first plurality of small cell strings, a second flexible interconnected bar of the plurality of flexible interconnected bars is formed along a total length of a second edge of a second large cell block of the plurality of large cell blocks formed by a second plurality of small cell strings, said second edge being aligned with the first edge, and a third flexible interconnected bar of the plurality of flexible interconnected bars is formed on top of, and welds together, both the first flexible interconnected bar and the second flexible interconnected bar along only a part of the total length of the first edge and a part of the total length of the second edge to couple the first and second large cell blocks; electrodes of the plurality of small square cell pieces are all on a back side and the plurality of small square cell pieces are formed by cutting a back-contact solar cell; a protective layer is attached to a surface of a light-receiving side by using an adhesive layer; a method for preparing the flexible and rollable back-contact solar cell module comprises:

pre-cutting the back-contact solar cell and the protective layer to form a plurality of incompletely-disconnected small square cell pieces and a plurality of small square protective layers;

attaching light-receiving sides of the plurality of incompletely-disconnected small square cell pieces and the plurality of small square protective layers to each other by the adhesive layer;

performing a fragmenting to form the plurality of small square cell pieces, of the first plurality of small cell strings, with a light-receiving side attached to the plurality of small square protective layers;

arranging the plurality of small square cell pieces of the first plurality of small cell strings, by a chip automatic fragmenting and arrangement device, and affixing a high-temperature resistant tape to a middle of a back side of the plurality of small square cell pieces, of the first plurality of small cell strings, to fix a position of the plurality of small square cell pieces, of the first plurality of small cell strings, and then welding the plurality of small square cell pieces, of the first plurality of small cell strings, in series or in parallel by a fourth flexible interconnected bar of the plurality of flexible interconnected bars to form the first plurality of small cell strings;

arranging the first plurality of small cell strings, and then welding the first plurality of small cell strings in series or in parallel by the first flexible interconnected bar to form the first large cell block; and welding the plurality of large cell blocks in series or in parallel by at least the third flexible interconnected bar to form the flexible and rollable back-contact solar cell module according to design requirements.

2. The flexible and rollable back-contact solar cell module according to claim 1, wherein the flexible and rollable back-contact solar cell module is allowed to be further be cut off at an appropriate position according to design requirements to re-form the plurality of large cell blocks, and the plurality of large cell blocks are re-connected in series or in parallel by at least one other flexible interconnected bar to form the flexible and rollable back-contact solar cell module satisfying new design requirements.

3. The flexible and rollable back-contact solar cell module according to claim 1, wherein a given flexible interconnected bar of the plurality of flexible interconnected bars is in the horizontal direction and is configured to connect positive and negative electrodes of the plurality of large cell blocks when the flexible and rollable back-contact solar cell module is formed by the plurality of large cell blocks connected in series.

4. The flexible and rollable back-contact solar cell module according to claim 1, wherein a given flexible interconnected bar of the plurality of flexible interconnected bars is in the vertical direction and is configured to connect positive electrodes of the plurality of large cell blocks and connect negative electrodes of the plurality of large cell blocks when the flexible and rollable back-contact solar cell module is formed by the plurality of large cell blocks connected in parallel.

5. The flexible and rollable back-contact solar cell module according to claim 1, wherein each of the plurality of small square cell pieces has a length of 1-100 mm and a width of 1-100 mm, and each of the plurality of small square cell pieces maintain a certain interval between each other.

6. The flexible and rollable back-contact solar cell module according to claim 1, wherein each of the plurality of flexible interconnected bars is a flexible copper clad laminate (FCCL) soft welding strip with a width of 0.1-20 mm, a flexible printed circuit board (FPCB), or a flexible tinned-copper strip; a gap between the first plurality of small cell strings connected by the fourth flexible interconnected bar is 0.1-5 mm, and each of the plurality of small cell strings comprises more than two small square cells.

7. The flexible and rollable back-contact solar cell module according to claim 1, wherein the protective layer is a hard material layer, and the hard material layer has a thickness of 0.2-2 mm and the hard material layer is made of glass, polycarbonate (PC), polymethyl methacrylate (PMMA), polypropylene (PP), polyethylene terephthalate (PET), or transparent fluorine material layer.

8. The flexible and rollable back-contact solar cell module according to claim 1, wherein the adhesive layer attached between the plurality of small square cell pieces, of the first plurality of small cell strings, and the protective layer is made of silica gel, ethylene vinyl acetate (EVA) glue, polyolefin elastomer (POE) glue, or double-sided glue, and the protective layer is cured by an ultraviolet (UV) light or a high temperature.

9. The flexible and rollable back-contact solar cell module according to claim 1, wherein the back-contact solar cell is an interdigitated back-contact (IBC) solar cell or an interdigitated heterojunction back-contact (HBC) solar cell.

10. The flexible and rollable back-contact solar cell module according to claim 2, wherein a given flexible interconnected bar of the plurality of flexible interconnected bars is in the horizontal direction and is configured to connect positive and negative electrodes of the plurality of large cell blocks when the flexible and rollable back-contact solar cell module is formed by the plurality of large cell blocks connected in series.

11. The flexible and rollable back-contact solar cell module according to claim 2, wherein a given flexible interconnected bar of the plurality of flexible interconnected bars is in the vertical direction and is configured to connect positive electrodes of the plurality of large cell blocks and connect negative electrodes of the plurality of large cell blocks when the flexible and rollable back-contact solar cell module is formed by the plurality of large cell blocks connected in parallel.

12. The flexible and rollable back-contact solar cell module according to claim 2, wherein each of the plurality of small square cell pieces has a length of 1-100 mm and a width of 1-100 mm, and each of the plurality of small square cell pieces maintain a certain interval between each other.

13. The flexible and rollable back-contact solar cell module according to claim 2, wherein each of the plurality of flexible interconnected bars is a flexible copper clad laminate (FCCL) soft welding strip with a width of 0.1-20 mm, a flexible printed circuit board (FPCB), or a flexible tinned-copper strip; a gap between the first plurality of small cell strings connected by the fourth flexible interconnected bar is 0.1-5 mm, and each of the plurality of small cell strings comprises more than two small square cells.

14. The flexible and rollable back-contact solar cell module according to claim 2, wherein the protective layer is a hard material layer, and the hard material layer has a thickness of 0.2-2 mm and the hard material layer is made of glass, polycarbonate (PC), polymethyl methacrylate (PMMA), polypropylene (PP), polyethylene terephthalate (PET), or transparent fluorine material layer.

15. The flexible and rollable back-contact solar cell module according to claim 2, wherein the adhesive layer attached between the plurality of small square cell pieces, of the first plurality of small cell strings, and the protective layer is made of silica gel, ethylene vinyl acetate (EVA) glue, polyolefin elastomer (POE) glue, or double-sided glue, and the protective layer is cured by an ultraviolet (UV) light or a high temperature.

16. The flexible and rollable back-contact solar cell module according to claim 2, wherein the back-contact solar cell is an interdigitated back-contact (IBC) solar cell or an interdigitated heterojunction back-contact (HBC) solar cell.

* * * * *